(12) United States Patent
Dautenhahn (10) Patent No.: US 9,198,300 B2
(45) Date of Patent: Nov. 24, 2015

(54) FLUX MANAGEMENT SYSTEM AND METHOD FOR A WAVE SOLDER MACHINE

(71) Applicant: Illinois Tool Works Inc., Glenview, IL (US)

(72) Inventor: Jonathan M. Dautenhahn, Linn Creek, MO (US)

(73) Assignee: Illinois Tool Works Inc., Glenview, IL (US)

( * ) Notice: Subject to any disclaimer, the term of this patent is extended or adjusted under 35 U.S.C. 154(b) by 93 days.

(21) Appl. No.: 14/162,198

(22) Filed: Jan. 23, 2014

(65) Prior Publication Data
US 2015/0208515 A1 Jul. 23, 2015

(51) Int. Cl.
| | |
|---|---|
| *B23K 37/00* | (2006.01) |
| *H05K 3/30* | (2006.01) |
| *B23K 3/06* | (2006.01) |
| *B23K 3/08* | (2006.01) |
| *B01D 46/30* | (2006.01) |
| *B01D 53/00* | (2006.01) |
| *B23K 1/008* | (2006.01) |
| *B23K 1/018* | (2006.01) |
| *B23K 1/08* | (2006.01) |
| *B23K 1/20* | (2006.01) |

(52) U.S. Cl.
CPC ............... *H05K 3/306* (2013.01); *B01D 46/30* (2013.01); *B01D 53/002* (2013.01); *B23K 1/008* (2013.01); *B23K 1/018* (2013.01); *B23K 1/085* (2013.01); *B23K 1/203* (2013.01); *B23K 3/0653* (2013.01); *B23K 3/08* (2013.01); *B23K 3/082* (2013.01); *B23K 37/00* (2013.01)

(58) Field of Classification Search
None
See application file for complete search history.

(56) References Cited

U.S. PATENT DOCUMENTS

| | | | | |
|---|---|---|---|---|
| 3,482,755 | A | * | 12/1969 | Raciti ............................. 228/34 |
| 3,515,330 | A | | 6/1970 | Bronson et al. |
| 4,079,879 | A | | 3/1978 | Watson, Jr. |
| 4,139,143 | A | | 2/1979 | Gumprecht |
| 4,295,868 | A | * | 10/1981 | Holter et al. .................... 55/302 |
| 4,366,351 | A | * | 12/1982 | Ditzig ......................... 200/16 R |
| 4,478,364 | A | * | 10/1984 | Ditzig ............................ 228/201 |
| 4,533,187 | A | * | 8/1985 | Kirkman .......................... 439/83 |
| 4,546,228 | A | | 10/1985 | Bonhomme |
| 4,659,003 | A | | 4/1987 | Simonetti |

(Continued)

FOREIGN PATENT DOCUMENTS

| | | |
|---|---|---|
| CN | 2610608 Y | 4/2004 |
| CN | 1893774 A | 1/2007 |

(Continued)

*Primary Examiner* — Kiley Stoner
(74) *Attorney, Agent, or Firm* — Lando & Anastasi LLP (57) ABSTRACT

A wave solder machine is configured to perform a wave solder operation on an electronic substrate. The wave solder machine includes a fluxing station configured to apply flux onto the electronic substrate, a pre-heating station configured to heat the electronic substrate, a wave soldering station configured to attach electronic components to the electronic substrate with solder, and a conveyor configured to transport substrates through a tunnel passing through the fluxing station, the pre-heating station and the wave soldering station. The wave solder machine further includes a flux management system configured to remove contaminants from the tunnel. The flux management system is in fluid communication with the tunnel for passage of a vapor stream from the tunnel through the flux management system and back to the tunnel. Methods of performing a wave solder operation are further disclosed.

16 Claims, 8 Drawing Sheets

(56) References Cited

U.S. PATENT DOCUMENTS

| | | | |
|---|---|---|---|
| 4,775,776 A | | 10/1988 | Rahn et al. |
| 4,798,218 A | * | 1/1989 | Sauvan ............................ 134/74 |
| 4,881,320 A | * | 11/1989 | Kohle et al. ..................... 29/841 |
| 4,921,156 A | | 5/1990 | Hohnerlein |
| 4,995,411 A | * | 2/1991 | Lowell et al. .................. 134/198 |
| 5,023,848 A | * | 6/1991 | Frey et al. ........................... 368/1 |
| 5,026,295 A | * | 6/1991 | Fong et al. ..................... 439/135 |
| 5,048,746 A | | 9/1991 | Elliott et al. |
| 5,069,380 A | | 12/1991 | Deambrosio |
| 5,121,874 A | | 6/1992 | Deambrosio et al. |
| 5,161,727 A | * | 11/1992 | Leturmy et al. ................ 228/37 |
| 5,163,599 A | | 11/1992 | Mishina et al. |
| 5,188,527 A | | 2/1993 | Laiquddin et al. |
| 5,193,735 A | | 3/1993 | Knight |
| 5,209,389 A | | 5/1993 | Sullivan et al. |
| 5,230,460 A | | 7/1993 | Deamborsio et al. |
| 5,240,169 A | * | 8/1993 | Gileta ........................ 228/180.1 |
| 5,322,209 A | | 6/1994 | Barten et al. |
| 5,347,103 A | | 9/1994 | LeMieux |
| 5,358,166 A | | 10/1994 | Mishina et al. |
| 5,364,007 A | | 11/1994 | Jacobs et al. |
| 5,379,943 A | | 1/1995 | Gibson |
| 5,388,468 A | * | 2/1995 | Sasson ........................ 73/865.9 |
| 5,398,865 A | * | 3/1995 | Mittag ........................... 228/219 |
| 5,405,074 A | | 4/1995 | Den Dopper et al. |
| 5,440,101 A | | 8/1995 | Cox et al. |
| 5,472,135 A | | 12/1995 | Taniguchi et al. |
| 5,520,320 A | | 5/1996 | McKean et al. |
| 5,524,810 A | | 6/1996 | Wathne |
| 5,611,476 A | | 3/1997 | Soderlund et al. |
| 5,911,486 A | | 6/1999 | Dow et al. |
| 5,941,448 A | * | 8/1999 | Sindzingre et al. ........... 228/206 |
| 5,971,246 A | | 10/1999 | Aun et al. |
| 6,074,203 A | | 6/2000 | Leturmy et al. |
| 6,123,250 A | | 9/2000 | De Klein et al. |
| RE36,960 E | | 11/2000 | Boswell et al. |
| 6,145,734 A | | 11/2000 | Taniguchi et al. |
| 6,345,757 B1 | | 2/2002 | Sakuyama et al. |
| 6,354,481 B1 | | 3/2002 | Rich et al. |
| 6,386,422 B1 | | 5/2002 | Cheng et al. |
| 6,394,794 B2 | | 5/2002 | Bloom et al. |
| 6,402,011 B1 | | 6/2002 | Taniguchi et al. |
| 6,437,289 B1 | | 8/2002 | Yokota |
| 6,446,855 B1 | | 9/2002 | Rich |
| 6,510,978 B1 | | 1/2003 | Koshi et al. |
| 6,576,030 B2 | * | 6/2003 | Mullins ........................ 55/385.1 |
| 6,686,566 B1 | | 2/2004 | Corey |
| 6,749,655 B2 | * | 6/2004 | Dautenhahn ................ 55/385.1 |
| 6,761,301 B2 | | 7/2004 | Mukuno et al. |
| 7,150,418 B2 | | 12/2006 | Watanabe et al. |
| 7,690,550 B2 | | 4/2010 | Yokota |
| 7,708,183 B2 | | 5/2010 | Dautenhahn |
| 7,735,708 B2 | | 6/2010 | Yamada |
| 7,951,244 B2 | | 5/2011 | Becker et al. |
| 7,988,031 B2 | | 8/2011 | Nakamura et al. |
| 8,110,015 B2 | | 2/2012 | Neiderman et al. |
| 8,128,720 B2 | | 3/2012 | Neiderman et al. |
| 8,196,799 B2 | | 6/2012 | Dautenhahn |
| 8,348,138 B2 | | 1/2013 | Dautenhahn |
| 2002/0162308 A1 | * | 11/2002 | Mullins et al. .................. 55/361 |
| 2002/0179693 A1 | | 12/2002 | Kawashima et al. |
| 2003/0196551 A1 | | 10/2003 | Dautenhahn ................... 95/273 |
| 2003/0218058 A1 | * | 11/2003 | Shaw et al. ..................... 228/230 |
| 2004/0178251 A1 | | 9/2004 | Trucco ....................... 228/248.1 |
| 2005/0050866 A1 | | 3/2005 | Mullins |
| 2005/0173497 A1 | | 8/2005 | Dokkedahl |
| 2006/0197266 A1 | * | 9/2006 | Keith .............................. 266/48 |
| 2007/0045382 A1 | | 3/2007 | Shibamura et al. |
| 2007/0241165 A1 | | 10/2007 | Deram et al. |
| 2008/0295686 A1 | * | 12/2008 | Neiderman et al. .............. 95/39 |
| 2009/0236402 A1 | | 9/2009 | Willenegger et al. |
| 2009/0282973 A1 | | 11/2009 | Nakamura et al. |
| 2010/0012709 A1 | * | 1/2010 | Nikaido et al. ............... 228/256 |
| 2010/0219568 A1 | | 9/2010 | Opferkuch |
| 2010/0264197 A1 | | 10/2010 | Aoyama et al. |
| 2011/0226843 A1 | * | 9/2011 | Yanaros et al. ............... 228/260 |
| 2011/0315746 A1 | | 12/2011 | Dautenhahn |
| 2013/0062399 A1 | | 3/2013 | McQuirk |
| 2013/0098974 A1 | * | 4/2013 | Dong et al. .................... 228/219 |
| 2013/0119112 A1 | | 5/2013 | Sukekawa et al. |
| 2013/0175323 A1 | | 7/2013 | Zhang et al. |
| 2014/0027495 A1 | * | 1/2014 | Arslanian et al. ............... 228/37 |
| 2014/0109431 A1 | | 4/2014 | Lee et al. |

FOREIGN PATENT DOCUMENTS

| | | | |
|---|---|---|---|
| CN | 201227707 Y | | 4/2009 |
| CN | 101648304 A | | 2/2010 |
| CN | 201824037 U | | 5/2011 |
| EP | 0681418 B1 | | 8/1999 |
| EP | 1732118 A1 | | 12/2006 |
| GB | 1504540 A | * | 3/1978 |
| JP | 62130770 A | | 6/1987 |
| JP | 2002198642 A | | 7/2002 |
| JP | 2005079466 A | | 3/2005 |
| JP | 5077038 A | | 11/2012 |

* cited by examiner

FLUX MANAGEMENT SYSTEM AND METHOD FOR A WAVE SOLDER MACHINE

BACKGROUND OF DISCLOSURE

1. Field of Disclosure

This application relates generally to the surface mount of electronic components onto a printed circuit board by employing a wave soldering process, and more particularly to a system and method for extracting and collecting vaporized contaminants (e.g., flux) out of a wave solder machine, and removing the collected contaminants without interrupting the wave soldering process.

2. Discussion of Related Art

In the fabrication of printed circuit boards, electronic components can be mounted to a printed circuit board by a process known as "wave soldering." In a typical wave solder machine, a printed circuit board is moved by a conveyor on an inclined path past a fluxing station, a pre-heating station, and finally a wave soldering station. At the wave soldering station, a wave of solder is caused to well upwardly (by means of a pump) through a wave solder nozzle and contact portions of the printed circuit board to be soldered.

Advancements in wave soldering processes have led to the use of inert atmosphere tunnel systems. When a wave solder process tunnel is inert, flux volatile contaminants that vaporize during the heating process are not able to be evacuated by an exhaust system as is typically done with a non-inert tunnel system. As a result, these volatile contaminants collect on internal components within the tunnel, and require extensive maintenance to clean.

Although flux management systems have been used in reflow ovens, such systems have not been employed in wave solder machines. Reference can be made to U.S. Pat. Nos. 6,749,655, 8,110,015 and 8,128,720, which are assigned to the assignee of the present disclosure, for systems and methods of removing contaminants from a reflow oven.

SUMMARY OF DISCLOSURE

One aspect of the disclosure is directed to a wave solder machine configured to perform a wave solder operation on an electronic substrate. In one embodiment, the wave solder machine comprises a fluxing station configured to apply flux onto the electronic substrate, a pre-heating station configured to heat the electronic substrate, a wave soldering station configured to attach electronic components to the electronic substrate with solder, a conveyor configured to transport substrates through a tunnel passing through the fluxing station, the pre-heating station and the wave soldering station, and a flux management system configured to remove contaminants from the tunnel. The flux management system is in fluid communication with the tunnel for passage of a vapor stream from the tunnel through the flux management system and back to the tunnel.

Embodiments of the wave solder machine further may include configuring the flux management system with a housing, a first stage unit provided within the housing, and a second stage unit provided within the housing and in fluid communication with the first stage unit. The first stage unit may include an air-to-air heat exchanger using compressed air as a cooling medium to condense flux vapor on contact with the air-to-air heat exchanger, with the first stage unit separating larger particles from a gas stream. The air-to-air heat exchanger may include a plurality of tubes configured to receive compressed air. The air-to-air heat exchanger further may include at least one airflow deflector plate in thermal contact with the plurality of tubes. The second stage unit may include a packed bed of steel balls contained within a perforated sheet metal structure. The perforated sheet metal structure of the second stage unit may include an upper structure portion and a lower structure portion, with the packed bed of steel balls being contained within the upper and lower structure portions. The flux management system further may include at least one collection container to collect contaminants from the second stage unit. The housing may include a first stage compartment configured to house components of the first stage unit and a second stage compartment configured to house components of the second stage unit. The housing further may include a divider wall positioned between the first stage compartment and the second stage compartment. The divider wall may include at least one opening formed therein to enable process gas passage between the first stage compartment and the second stage compartment. The flux management system further may include a blower secured to the housing and configured to move gas within the second stage compartment back to the first stage compartment.

Another aspect of the present disclosure is directed to a method for removing vaporized contaminants from inside a wave solder machine. In one embodiment, the method comprises: extracting a gas including vaporized contaminants from a tunnel of a wave solder machine; directing the gas to a flux management system configured to remove contaminants from the gas; removing contaminants from the gas with the flux management system to produce a processed gas; and introducing the processed gas back into the tunnel.

Embodiments of the method further may include collecting the removed contaminants from the cooling coil, separating gas within the first stage unit from the second stage unit, and/or moving a portion of gas within the second stage unit back to the first stage unit. Removing contaminants from the gas with the flux management system may include passing the gas over a first stage unit of the flux management system having a heat exchanger to condense the gas. Removing contaminants from the gas with the flux management system further may include passing the gas over a second stage unit of the flux management system having a filter assembly. The filter assembly of the second stage unit may include includes a packed bed of steel balls contained within a perforated sheet metal structure.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This disclosure is not limited in its application to the details of construction and the arrangement of components set forth in the following description or illustrated in the drawings. The disclosure is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Embodiments of the disclosure may be directed to the use of a two-stage flux extraction and filtration system that is used with a wave solder machine. The wave solder machine is one of several machines in a printed circuit board fabrication/assembly line. As mentioned above, a conveyor delivers printed circuit boards to be processed by the wave solder machine. Upon entering the wave solder machine, each printed circuit board travels along an inclined path past a fluxing station and a pre-heating station to condition the printed circuit board for wave soldering. Once conditioned, the printed circuit board travels to a wave soldering station to apply molten solder material to the printed circuit board. In one embodiment, the wave soldering station includes a wave solder nozzle in fluid communication with a reservoir of solder material. A pump is configured to deliver molten solder material to the wave solder nozzle from the reservoir. Once soldered, the printed circuit board exits the wave solder machine via the conveyor to another station provided in the fabrication line, e.g., a pick-and-place machine. A controller is provided to automate the operation of the several stations of the wave solder machine, including but not limited to the fluxing station, the pre-heating station, and the wave soldering station, in the well known manner.

The flux typically includes a vehicle, solvent, activators and other additives. The vehicle is a solid or nonvolatile liquid that coats the surface to be soldered and can include rosin, resins, glycols, polyglycols, polyglycol surfactants, and glycerine. The solvent, which evaporates during the pre-heat and wave soldering process, serves to dissolve the vehicle activators, and other additives. Examples of typical solvents include alcohols, glycols, glycol esters and/or glycol ethers and water. The activator enhances the removal of metal oxide from the surfaces to be soldered. Common activators include amine hydrochlorides, dicarboxylic acids, such as adipic or succinic acid, and organic acids, such as citric, malic or abietic acid. Other flux additives can include surfactants, viscosity modifiers and additives for providing low slump or good tack characteristics for holding the components in place before reflow.

Advancements in wave soldering processes have led to the use of inert atmosphere tunnel systems in wave solder machines. When wave solder process tunnels are inert, the flux volatile contaminants that vaporize during the heating process are not able to be evacuated by exhaust systems as is typically done with non-inert tunnel systems. As a result, these volatile contaminants collect on internal components within the tunnel, and require extensive maintenance to clean. With the two-stage flux management system of embodiments of the present disclosure, the first stage utilizes an air-to-air heat exchanger configured to condense the vaporized flux volatile contaminants when a cooling medium is introduced into the heat exchanger. The second stage of the flux management system includes a filter medium to collect the volatile contaminants.

The two-stage filtration/separation management system of embodiments of the present disclosure is designed to remove vaporized contaminants from inside the process tunnel of the wave solder machine. A first stage unit focuses on separating out the large particles by condensation using an air-to-air heat exchanger. A second stage unit filters the small particles through interaction with a packed bed of steel balls. The second filtration stage also incorporates heaters to provide self-cleaning of the packed bed filter. Additionally, the system incorporates a collection container to collect the flux and a sensor to notify when the collection container is full.

Figure 1:
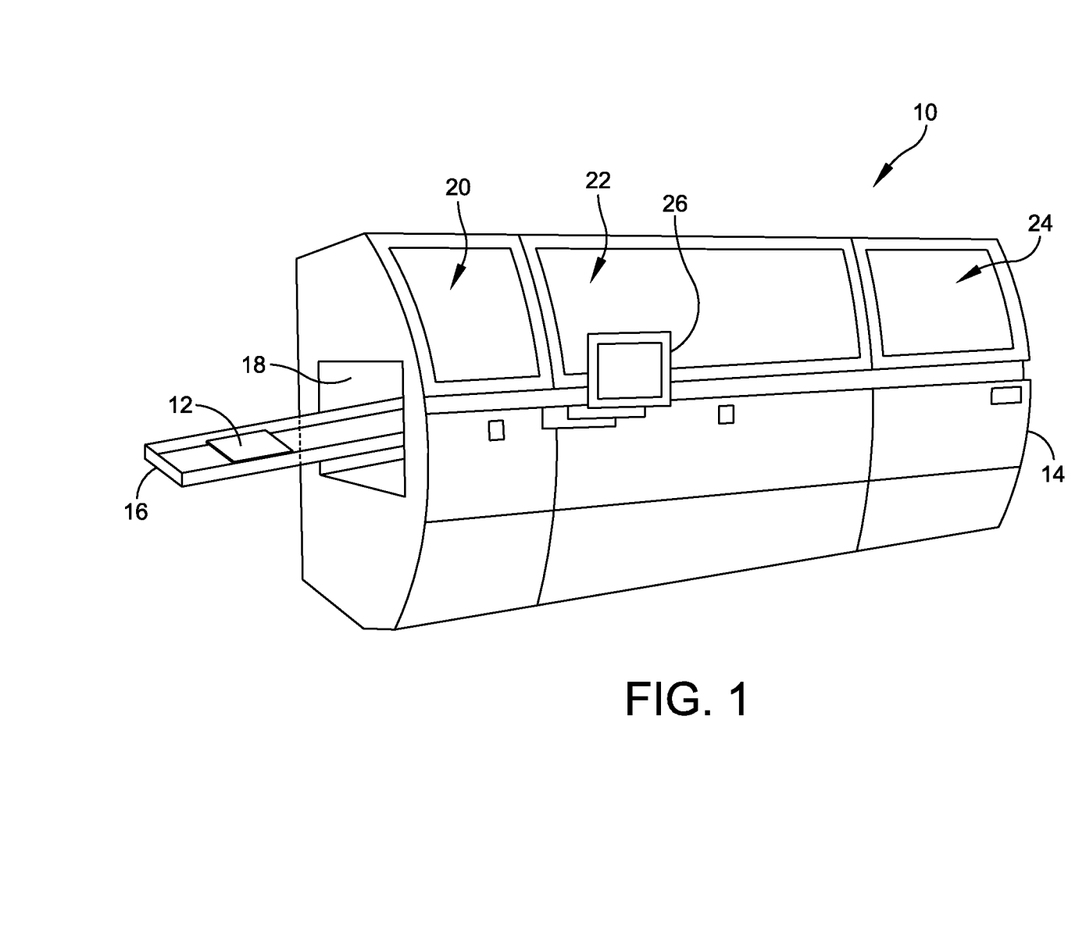
FIG. 1 is a perspective view of a wave solder machine.

For purposes of illustration, and with reference to FIG. 1, embodiments of the present disclosure will now be described with reference to a wave solder machine, generally indicated at 10, which is used to perform a solder application on a printed circuit board 12. The wave solder machine 10 is one of several machines in a printed circuit board fabrication/assembly line. As shown, the wave solder machine 10 includes a housing 14 adapted to house the components of the machine. The arrangement is such that a conveyor 16 delivers printed circuit boards to be processed by the wave solder machine 10. Upon entering the wave solder machine 10, each printed circuit board 12 travels along an inclined path along the conveyor 16 through a tunnel 18, which includes a fluxing station, generally indicated at 20, and a pre-heating station, generally indicated at 22, to condition the printed circuit board for wave soldering. Once conditioned (i.e., heated), the printed circuit board 12 travels to a wave soldering station, generally indicated at 24, to apply solder material to the printed circuit board. A controller 26 is provided to automate the operation of the several stations of the wave solder machine 10, including but not limited to the fluxing station 20, the pre-heating station 22, and the wave soldering station 24, in the well known manner.

Figure 2:
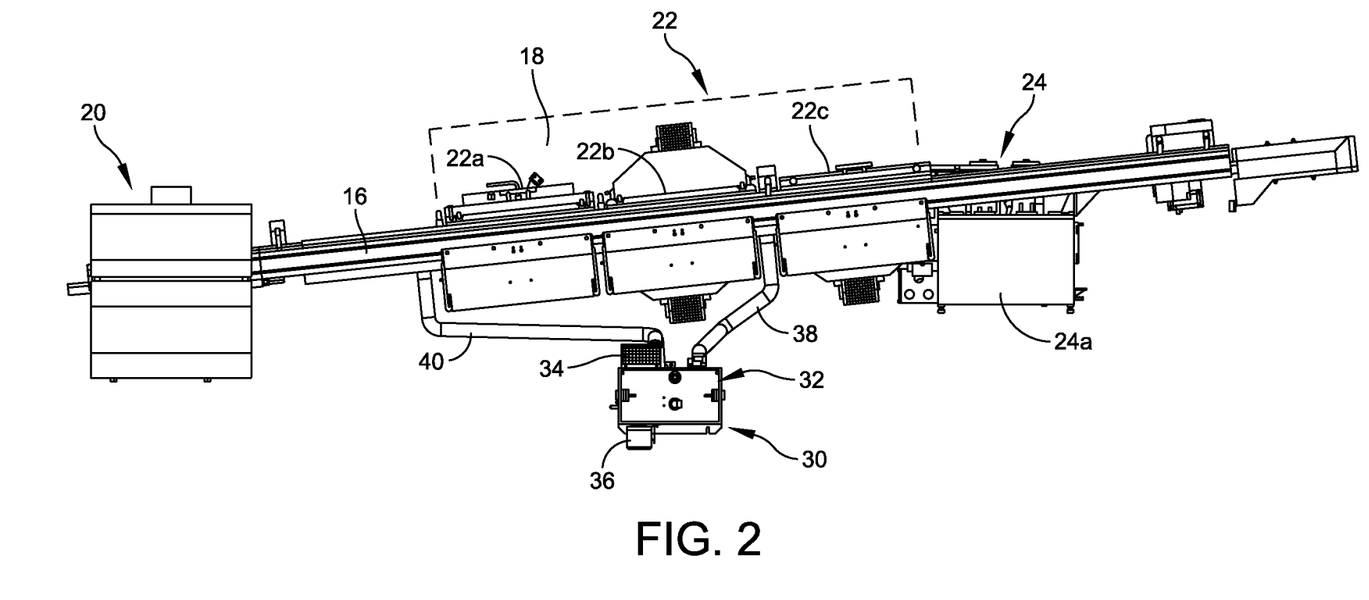
FIG. 2 is a side elevational view of the wave solder machine with external packaging removed to reveal internal components of the wave solder machine.

Referring to FIG. 2, the fluxing station 20 is configured to apply flux to the printed circuit board as it travels on the conveyor 16 through the wave solder machine 10. The pre-heating station includes several pre-heaters (e.g., pre-heaters 22a, 22b and 22c), which are designed to incrementally increase the temperature of the printed circuit board as it travels along the conveyor 16 through the tunnel 18 to prepare the printed circuit board for the wave soldering process. As shown, the wave soldering station 24 includes a wave solder nozzle in fluid communication with a reservoir 24a of solder material. A pump is provided within the reservoir to deliver molten solder material to the wave solder nozzle from the reservoir. Once soldered, the printed circuit board exits the wave solder machine 10 via the conveyor 16 to another station provided in the fabrication line, e.g., a pick-and-place machine.

The wave solder machine 10 further includes a two-stage flux management system, generally indicated at 30, to remove volatile contaminants from the tunnel 18 of the wave solder machine. As shown in FIG. 2, the flux management system 30 is positioned below the pre-heating station 22. In one embodiment, the flux management system is supported by a frame of the housing 14 within the wave solder machine, and is in fluid communication with the tunnel 18, which is schematically illustrated in FIG. 2. The flux management system 30 is configured to receive contaminated gas from the tunnel 18, treat the gas through a two-stage process, and return clean gas back to the tunnel. The flux management system 30 is particularly configured to remove volatile contaminants from the gas, especially in inert atmospheres.

The flux management system 30 includes a housing, generally indicated at 32, which is configured to house the components of the two-stage filtration system, a blower unit 34 supported by the housing, and a removable collection container 36, which is configured to receive the contaminants separated from the gas treated by the flux management system. The flux management system 30 is connected to tunnel 18 by an inlet conduit 38, which is positioned within the pre-heating station 22 and configured to receive contaminated gas from the tunnel 18, and an outlet conduit 40, which is positioned at the front of the pre-heating station and configured to return "clean" gas back to the tunnel. The locations of where the inlet conduit 38 receives contaminated gas and where the outlet conduit 40 delivers "clean" gas back to the tunnel 18 may be varied and still fall within the scope of the present disclosure. In addition, multiple inlet conduits and outlet conduits may be provided to increase the volume of contaminated gas to be treated by the flux management system 30.

Figure 3:
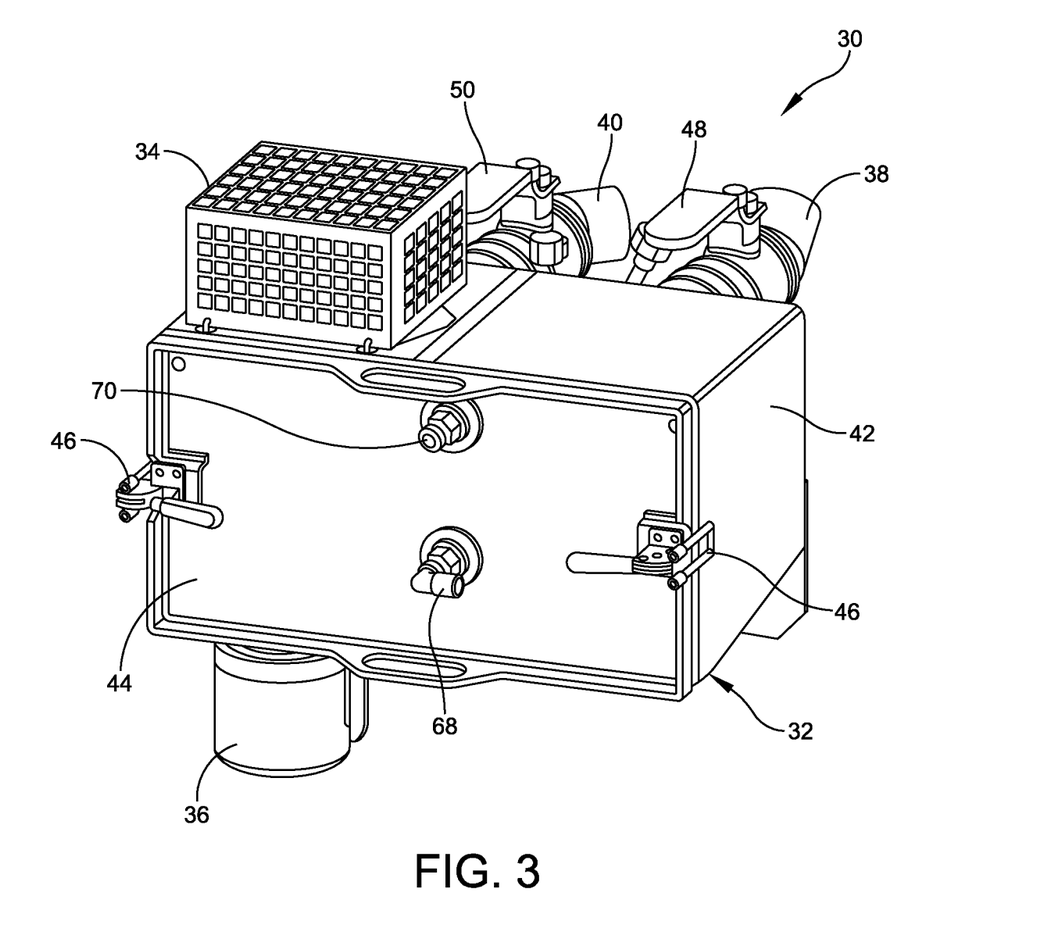
FIG. 3 is a perspective view of a flux management system of embodiments of the present disclosure provided in the wave solder machine.

Referring to FIG. 3, the housing 32 of the flux management system 30 includes a box-like structure 42 having an open front, and a door 44, which is removably coupled to the box-like structure by a pair of hinges, each indicated at 46. The box-like structure 42 includes a top wall on which the blower unit 34 is mounted. The box-like structure 42 further includes a back wall having a connector to attach the inlet conduit 38 to the housing 32. As mentioned above, the inlet conduit 38 is in communication with the tunnel 18 and is designed to deliver contaminated gas from the tunnel to the interior of the housing 32 to remove the contaminants from the gas. Similarly, the back wall of the box-like structure 42 includes another connector to attach the outlet conduit 40 to the housing 32. The outlet conduit 40 is provided to reintroduce "clean" gas back into the tunnel 18. As shown, the inlet conduit 38 includes a ball valve 48 that opens and closes communication between the tunnel 18 and the housing 32 of the flux management system 30. Similarly, the outlet conduit 40 includes a ball valve 50 that opens and closes communication between the tunnel 18 and the housing 32 of the flux management system 30. The box-like structure 42 further includes a bottom wall on which the collection container is mounted by a drain provided in the bottom wall.

Figure 4:
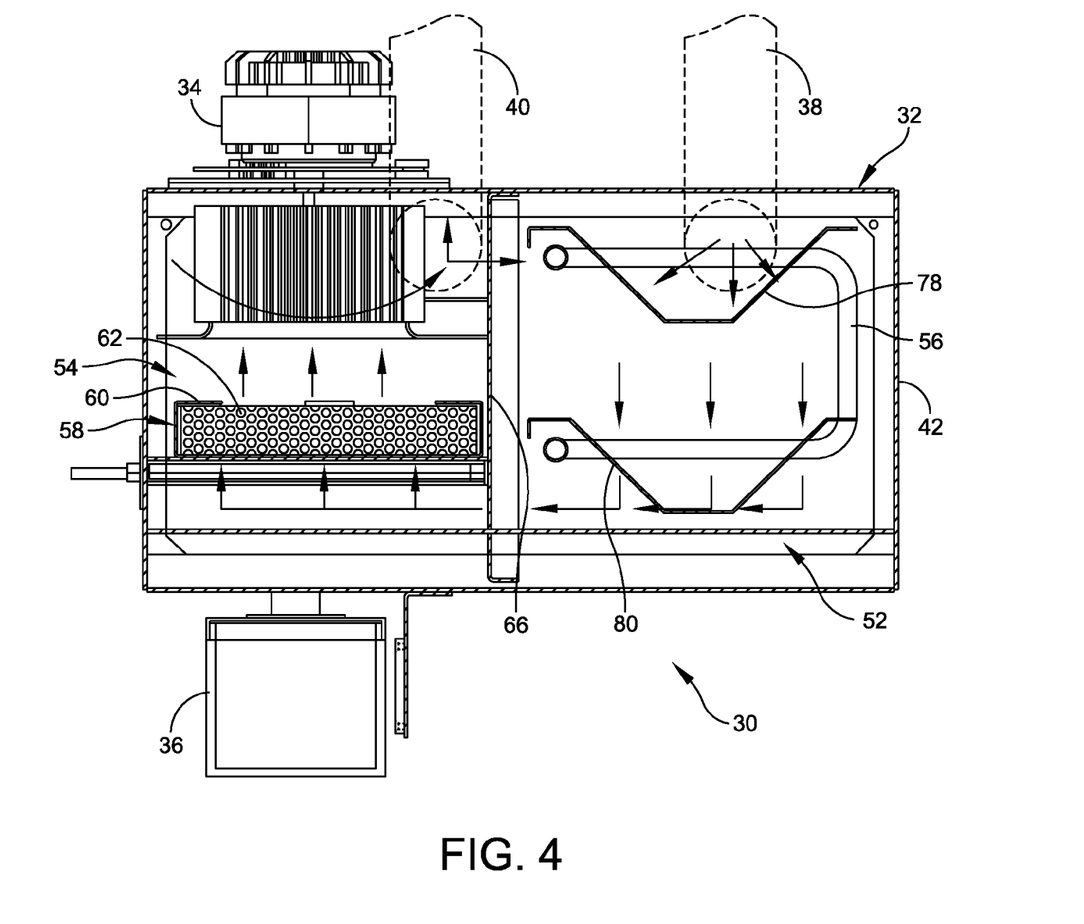
FIG. 4 is a cross-sectional view of the flux management system.
Figure 5:
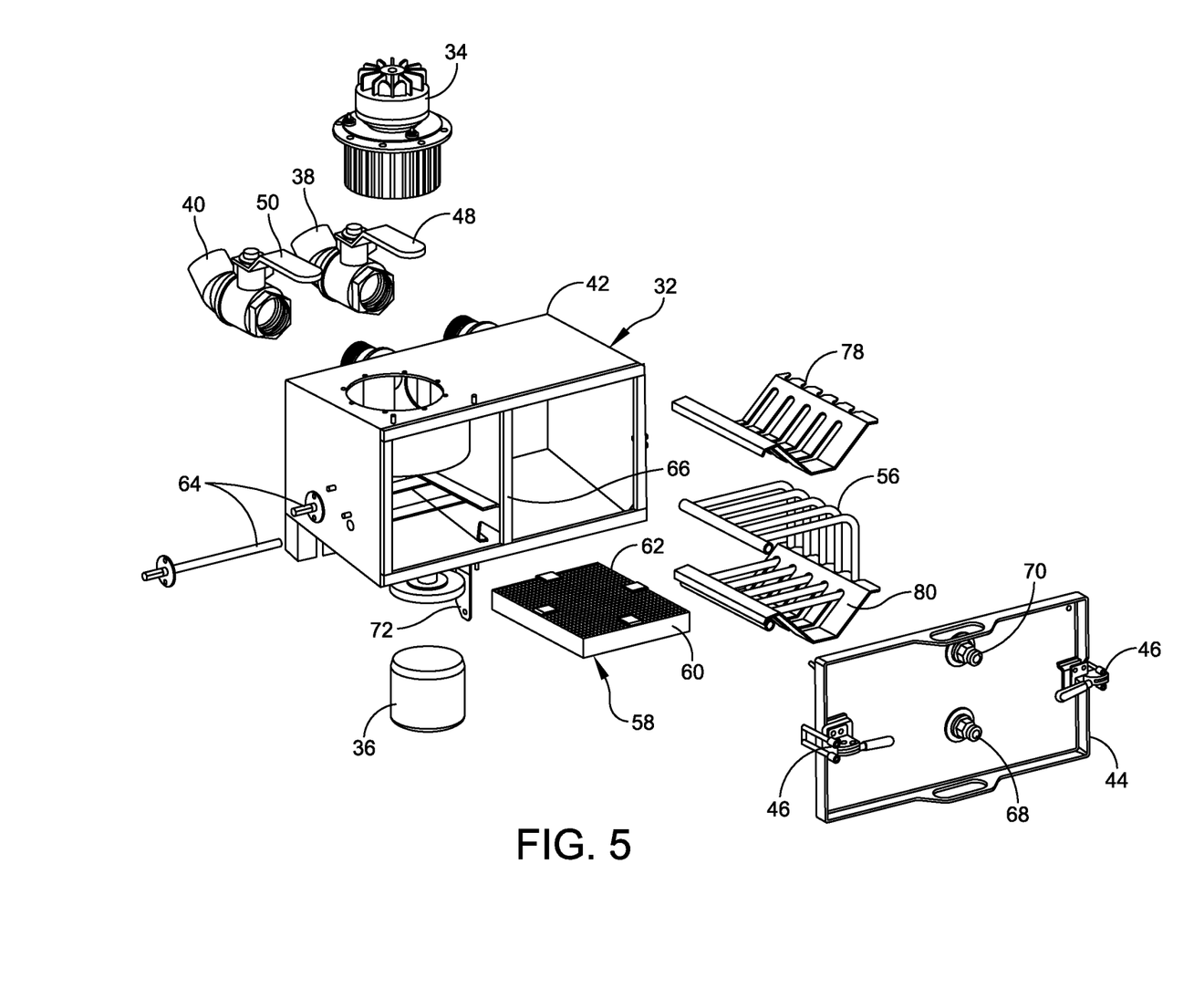
FIG. 5 is an exploded perspective view of the flux management system.

Referring to FIGS. 4 and 5, the flux management system 30 further includes a first stage unit, generally indicated at 52, and a second stage unit, generally indicated at 54. As shown, the first stage unit 52 and the second stage unit 54 are both supported by the box-like structure 42 of the housing 32, and are configured to remove contaminants introduced into the housing via the inlet conduit 38. In one embodiment, the first stage unit 52 includes an air-to-air heat exchanger 56 that uses compressed air through a plurality of tubes to act as a cooling medium to condense flux vapor on contact. The first stage unit 52 of the flux management system 30 separates the larger particles from the process gas stream, which are generally the resins and rosins of the flux. These particles form a sticky, highly viscous, and difficult-to-clean residue so it is important to remove these particles to reduce clogging of the filtration media of the second stage. As shown, the door 44 of the housing 32 includes a compressed air inlet 68 to deliver compressed air to the tubes of the air-to-air heat exchanger 56 and an outlet 70 to exhaust air from the heat exchanger. The inlet 68 is connected to a suitable source of compressed air to deliver the cooling medium to the heat exchanger 56. The outlet 70 is connected to exhaust air to atmosphere.

The second stage unit 54 of the flux management system 30 includes a filter assembly 58 to remove the smaller, lightweight particles from the gas stream introduced into the second stage unit from the first stage unit 52. In one embodiment, the filter assembly 58 includes a perforated sheet metal structure 60 configured to contain a packed bed 62 of steel balls. The small, lightweight particles, consisting mainly of alcohols and solvents, remaining after passing through the heat exchanger 56 of the first stage unit 52 are passed through the packed bed 62 making multiple collisions with the steel balls. Since the liquid contained within the gas vapor will spread out on contact with the surface of the steel balls, these steel balls are determined to be wettable. Therefore, upon initial collision of the particles with the steel balls, heterogeneous nucleation occurs and the steel balls become covered with a film of liquid. Once the packed bed 62 of steel balls is completely covered by the film, the particles within the vapor collide with this film of liquid. Since these are like substances, homogeneous nucleation occurs and the liquid builds up forming droplets.

Due to the effect of gravity, this second stage unit 54 generally cleans itself. The droplets that build up on the steel balls of the packed bed 62 become large enough that their weight overcomes the cohesion forces and they drop to the bottom of the housing 32. However, since there will always be small portion of the highly viscous particles make it past the first stage unit 52, heaters, each indicated at 64, are installed beneath the packed bed 62 of the second stage unit 54 that can be turned on periodically to aid in drainage and cleaning. As collected flux residue gets heated its viscosity is reduced and drainage can occur. The removable collection container 36 is positioned to collect flux residues as they drain to the bottom wall of the housing 32. In one embodiment, a sensor 72 may be mounted adjacent to the collection container 36 to signal when the collection container is full and in need of emptying or replacing. The controller 26 may be configured to receive the signal from the sensor 72. As will be discussed in greater detail below, the flux management system is configured to perform multiple passes of contaminated gas through the system to increase collection efficiency. In one embodiment, the flux management system 30 also incorporates a re-circulation bypass in which approximately one-half of the process gas passing through the system is returned to the first stage unit 52 from the second stage unit 54, and passed through the entire system again.

Figure 6:
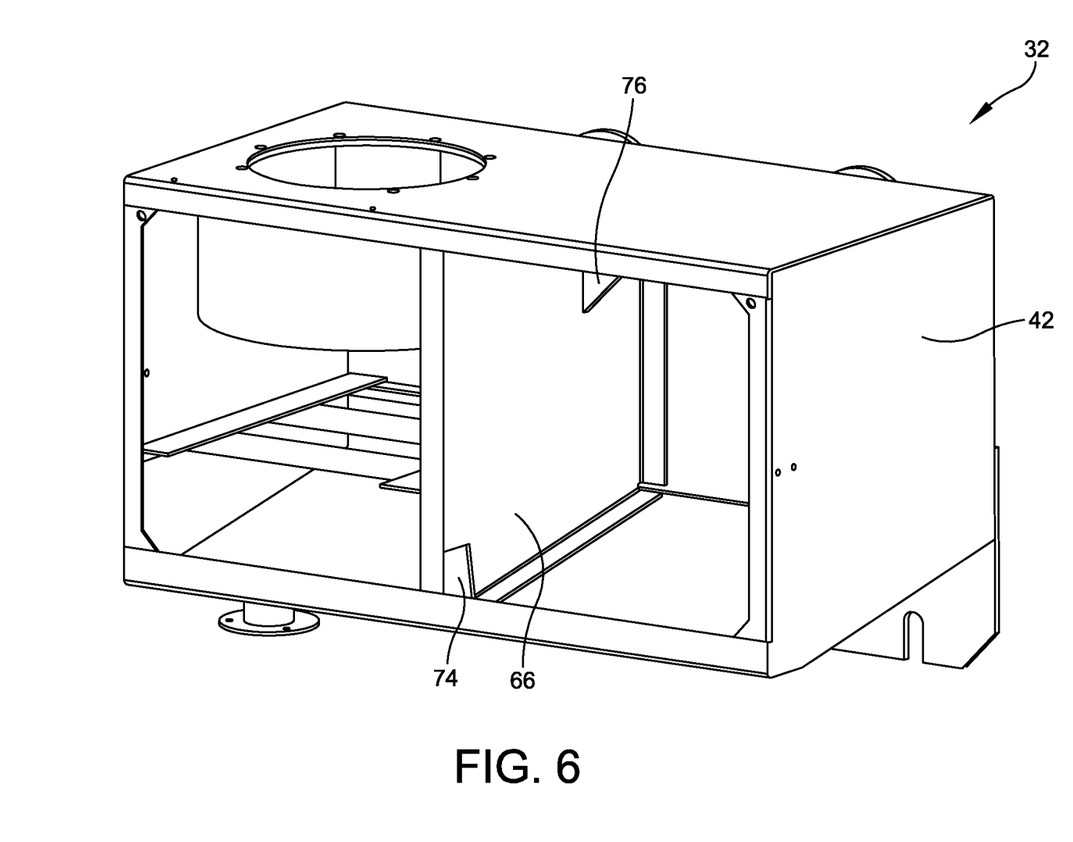
FIG. 6 is a perspective view of a housing of the flux management system.

Referring to FIG. 6, the box-like structure 42 of the housing 32 of the flux management system 30 further includes a divider wall 66, which divides the first stage unit 52 from the second stage unit 54. The divider wall 66 has two openings 74, 76 formed therein for the passage of gas from the first stage unit 52 to the second stage unit 54, and the passage of the second stage unit back to the first stage unit. Specifically, the first opening 74 allows the passage of process gas from a compartment defined by the first stage unit 52 to a compartment defined by the second stage unit 54. The second opening 76 is located on the downstream side of the blower unit 34, and allows the passage of approximately one-half of the process gas to return to the compartment of the first stage unit 52 to be circulated through the system again. As shown, the housing 32 is specifically configured to receive and mount the blower unit 34 to the housing, with the blower unit facilitating the recirculation of gas back to the first stage unit 52.

Figure 7:
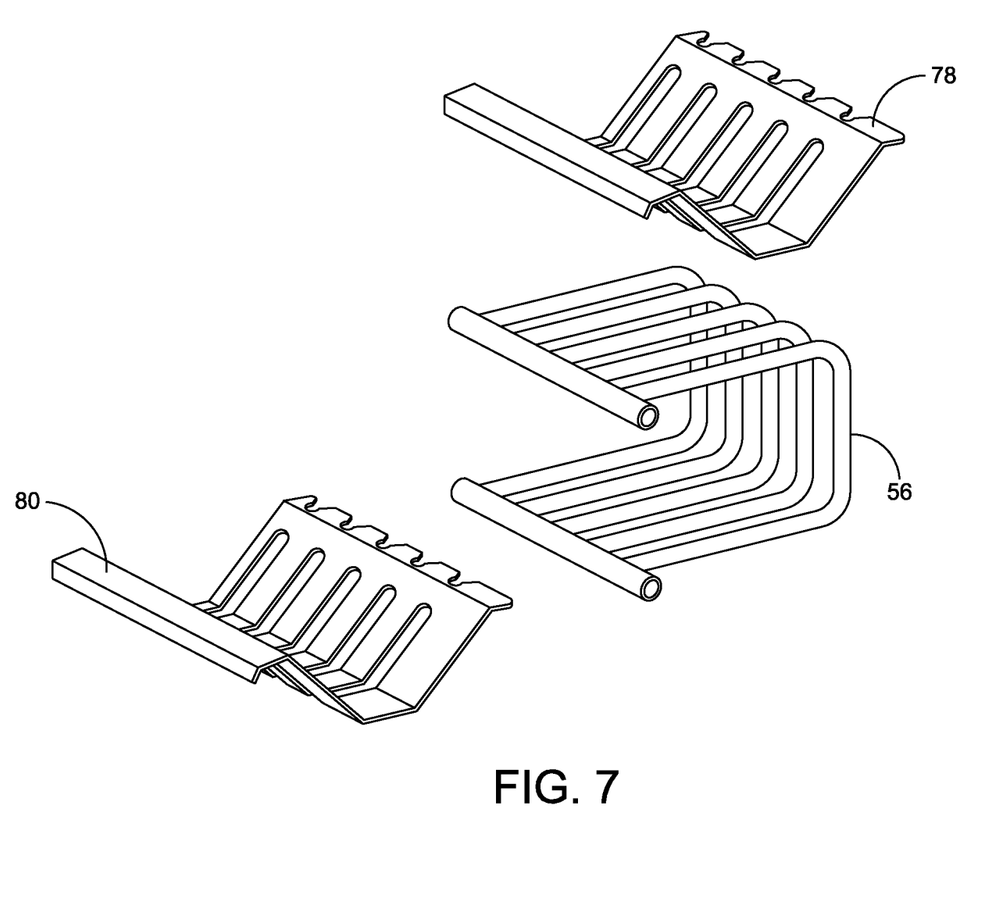
FIG. 7 is a perspective view of a heat exchanger of the flux management system.

Referring to FIG. 7, the heat exchanger 56 incorporates two removable airflow deflector plates 78, 80, which are provided to manipulate the flow of gas within the compartment of the first stage unit 52. These plates 78, 80 serve two purposes. The plates 78, 80 add surface area to increase efficiency of condensation which increases flux collection. As shown, each plate 78, 80 includes a plurality of slots formed therein through which a plurality of tubes of the heat exchanger 56 extend when assembled. The arrangement is such that the heat exchanger 56 engages the plates 78, 80 to cool the plates when introducing a cooling medium (e.g., compressed air) into the inlet 68. In addition, the plates 78, 80 impede the flow of the process gas which allows for more time spent in the condensation compartment of the first stage unit 52, which also increases efficiency. As shown in FIG. 4, the plates 78, 80 are suitably mounted to the housing 32 within the compartment defined by the first stage unit 52.

Figure 8:
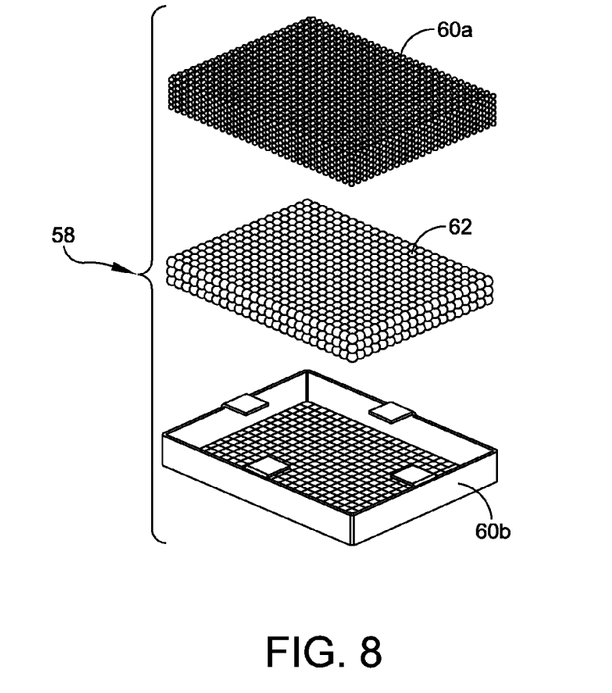
FIG. 8 is an exploded perspective view of a packed bed filter assembly of the flux management system.

Referring to FIG. 8, in one embodiment, the sheet metal structure 60 of the filter assembly 58 consists of perforated sheet metal upper and lower halves 60a, 60b. As described, the packed bed 62 of steel balls is contained within the upper and lower halves 60a, 60b. The packed bed 62 may consist of several hundred steel balls. The filter assembly 58 is self-contained so that it can be easily removed from the housing 32 of the flux management system 30 to be cleaned.

Figure 9A:
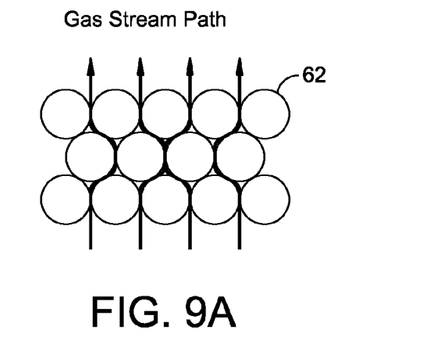
FIGS. 9A-9C are schematic illustrations of a progression of flux collection through the packed bed filter assembly.
Figure 9B:
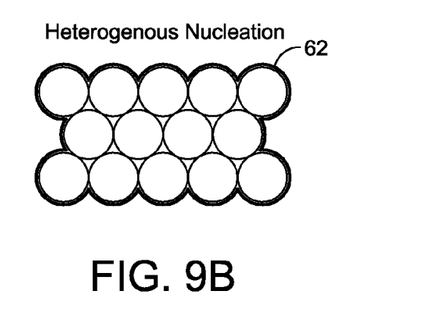
Figure 9C:
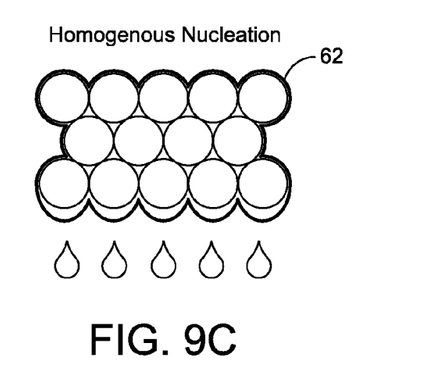

FIGS. 9A-9C illustrate the progression of flux collection through the packed bed of balls 62 of the filter assembly 58. FIG. 9A illustrates the gas stream path flowing through the packed bed 62. FIG. 9B illustrates a liquid film attached to the packed bed 62. FIG. 9C illustrates a formation of liquid droplets being released from the packed bed 62. The large particles released from the filter assembly 58 drop onto the bottom wall of the housing 32 and travel through the opening 76 toward the collection container 36. The bottom wall of the housing 32 may be tilted toward the collection container 36 to facilitate the movement of liquefied contaminated flux to the collection container.

With the provision of the flux management system 30, a process gas flow pattern through the wave solder machine 10 is as follows: 1) contaminated process gas extracted from tunnel 18; 2) the contaminated process gas is delivered from the inlet conduit 38 to the flux management system 30; 3) the contaminated process gas flows through the first stage unit 52; 4) the process gas flows from the first stage unit 52 to the second stage unit 54 through the first opening 74 of the divider wall 66; 5) the process gas flows through the second stage unit 54, and in particular the filter assembly 58; 6) the blower unit 34 drives the movement of approximately one-half of the processed gas back to the first stage unit 52 through the second opening 76 of the divider wall 66; and 7) the remaining one-half of the processed gas (cleaned gas) is returned to the tunnel 18.

Variations of the flux management system may include changing and/or modifying the size and shape of the heat exchanger and the housing of the flux management system. Variations may further include changing and/or modifying the size and number of steel balls in packed bed and the material of balls, which may be something other than steel as long as the balls can withstand the temperature and provide a wettable surface for the flux to adhere. Other variations may include a method to trigger a cleaning cycle of the processed gas contained within the tunnel, a method to warn of need for replacement of collection containers, and modifying the amount of the volumetric flow of gas through system and re-circulation percentage.

Thus, it should be observed that the flux management system of the embodiments of the disclosure is effective for use on a wave solder machine. The flux management system is configured to remove flux contaminants from the tunnel of the wave solder machine. Specifically, vaporized flux inside the wave solder tunnel, if not removed and contained, can build up on the interior surfaces of the machine. Excessive build-up within the tunnel can result in damage to machine components and/or product passing through the oven if flux drips onto them. This flux management system of embodiments of the present disclosure reduces this flux build-up, thereby reducing cost of maintenance for cleaning, lost production due to machine downtime, and damaged product from flux contamination.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A wave solder machine configured to perform a wave solder operation on an electronic substrate, the wave solder machine comprising:
    a fluxing station configured to apply flux onto the electronic substrate;
    a pre-heating station configured to heat the electronic substrate;
    a wave soldering station configured to attach electronic components to the electronic substrate with solder;
    a conveyor configured to transport substrates through a tunnel passing through the fluxing station, the pre-heating station and the wave soldering station; and
    a flux management system configured to remove contaminants from the tunnel, the flux management system being in fluid communication with the tunnel for passage of a vapor stream from the tunnel through the flux management system and back to the tunnel, the flux management system including a housing, a first stage unit provided within the housing, and a second stage unit provided within the housing and in fluid communication with the first stage unit, the first stage unit including an air-to-air heat exchanger using compressed air as a cooling medium to condense flux vapor on contact with the air-to-air heat exchanger, the first stage unit separating larger particles from a gas stream, the air-to-air heat exchanger including a plurality of tubes configured to receive compressed air, the air-to-air heat exchanger including at least one airflow deflector plate in thermal contact with the plurality of tubes of the air-to-air heat exchanger.

2. The wave solder machine of claim 1, wherein the second stage unit includes a packed bed of steel balls contained within a perforated sheet metal structure.

3. The wave solder machine of claim 2, wherein the perforated sheet metal structure of the second stage unit includes an upper structure portion and a lower structure portion, with the packed bed of steel balls being contained within the upper and lower structure portions.

4. The wave solder machine of claim 2, wherein the flux management system further includes at least one collection container to collect contaminants from the second stage unit.

5. The wave solder machine of claim 1, wherein the housing includes a first stage compartment configured to house components of the first stage unit and a second stage compartment configured to house components of the second stage unit.

6. The wave solder machine of claim 5, wherein the housing further includes a divider wall positioned between the first stage compartment and the second stage compartment.

7. The wave solder machine of claim 6, wherein the divider wall includes at least one opening formed therein to enable process gas passage between the first stage compartment and the second stage compartment.

8. The wave solder machine of claim 7, wherein the flux management system further includes a blower secured to the housing and configured to move gas within the second stage compartment back to the first stage compartment.

9. A method for removing vaporized contaminants from inside a wave solder machine, the method comprising:
   extracting a gas including vaporized contaminants from a tunnel of a wave solder machine;
   directing the gas to a flux management system configured to remove contaminants from the gas;
   removing contaminants from the gas with the flux management system to produce a processed gas; and
   introducing the processed gas back into the tunnel,
   wherein removing contaminants from the gas with the flux management system includes passing the gas over a first stage unit of the flux management system having a heat exchanger to condense the gas, passing the gas over a second stage unit of the flux management system having a filter assembly, the heat exchanger including a plurality of tubes configured to receive compressed air and at least one air flow deflector plate in thermal contact with the plurality of tubes, and manipulating the flow of gas within the first stage unit with the deflector plate.

10. The method of claim 9, wherein the filter assembly of the second stage unit includes a packed bed of steel balls contained within a perforated sheet metal structure.

11. The method of claim 9, further comprising collecting the removed contaminants.

12. The method of claim 9, further comprising separating gas within the first stage unit from the second stage unit.

13. The method of claim 12, further comprising moving a portion of gas within the second stage unit back to the first stage unit.

14. The wave solder machine of claim 1, wherein the deflector plate includes a plurality of slots formed therein through which the plurality of tubes of the heat exchanger extend.

15. The method of claim 9, wherein the deflector plate includes a plurality of slots formed therein through which a plurality of tubes of the heat exchanger extend.

16. A method for removing vaporized contaminants from inside a wave solder machine, the method comprising:
   extracting a gas including vaporized contaminants from a tunnel of a wave solder machine;
   directing the gas to a flux management system configured to remove contaminants from the gas;
   removing contaminants from the gas with the flux management system to produce a processed gas; and
   introducing the processed gas back into the tunnel,
   wherein removing contaminants from the gas with the flux management system includes passing the gas over a first stage unit of the flux management system having a heat exchanger to condense the gas, and passing the gas over a second stage unit of the flux management system having a filter assembly, the heat exchanger including a plurality of tubes configured to receive compressed air and at least one air flow deflector plate in thermal contact with the plurality of tubes, the flow of the gas over the heat exchanger of the first stage unit being impeded by the deflector plate.

* * * * *